United States Patent [19]

Anderson et al.

[11] Patent Number: 4,876,499
[45] Date of Patent: Oct. 24, 1989

[54] DIFFERENTAL VOLTAGE CONTROLLED EXPONENTIAL CURRENT SOURCE

[75] Inventors: James R. Anderson, Chicago; Richard Brander, Cicero, both of Ill.

[73] Assignee: Beltone Electronics Corporation, Chicago, Ill.

[21] Appl. No.: 269,618

[22] Filed: Nov. 10, 1988

Related U.S. Application Data

[60] Continuation of Ser. No. 202,664, Jun. 6, 1988, Pat. No. 4,829,270, which is a division of Ser. No. 838,924, Mar. 12, 1986, Pat. No. 4,792,977.

[51] Int. Cl.$^4$ .............................................. G05F 3/22
[52] U.S. Cl. .................................... 323/312; 307/492; 328/145; 330/260
[58] Field of Search .................... 323/312; 328/145; 330/252, 260; 307/492

[56] References Cited

U.S. PATENT DOCUMENTS

3,678,294 7/1972 Glathe .................................. 307/492
3,914,624 10/1975 Jackson .............................. 307/492

Primary Examiner—William H. Beha, Jr.
Attorney, Agent, or Firm—Allegretti & Witcoff Ltd.

[57] ABSTRACT

A current source provides an output current that is substantially exponentially related to a difference between input voltages. The output current is also substantially linearly related to an input current. The current source includes first, second and third transistors interconnected to one another. The basic current source may be used as a "building block" to produce more complex control functions.

1 Claim, 3 Drawing Sheets

Fig. 3

DIFFERENTIAL VOLTAGE CONTROLLED EXPONENTIAL CURRENT SOURCE

This is a division of application Ser. No. 202,664, filed June 6, 1988 U.S. Pat. No. 4,829,270. Application Ser. No. 202,664 is a division of application Ser. No. 838,924 filed Mar. 12, 1986 U.S. Pat. No. 4,792, 977.

BACKGROUND OF THE INVENTION

The present invention relates generally to hearing aids, and more particularly, to circuits that more compactly, economically, and effectively present a modified and amplified sound for the wearer of a hearing aid. In its most basic form, a hearing aid is a device which receives a sound signal and furnishes a modified sound signal to the wearer of the hearing aid, so that the wearer may hear better.

Hearing impaired persons differ considerably in the degree and pattern of their hearing loss. This is reflected in their audiograms.

An audiogram is a chart of hearing threshold level (HTL) versus frequency. The HTL is measured on a logarithmic (decibel) scale and compares an individual's threshold of detection of a tone to that of normal hearing persons.

Audiograms can differ in level from near normal (0 dB HTL) to profound loss (greater than 100 dB HTL). They can vary in pattern from a flat audiogram (approximately equal HTL over the relevant frequency range) to a sharply falling audiogram (HTL increasing at more than 30 dB per octave of frequency increase) or to a rising audiogram (HTL decreasing with frequency). Within the category of sharply falling audiograms, the frequency at which the audiogram begins to fall can vary greatly between individuals.

Patterns of hearing loss can also differ considerably in the relationship between the subjectively experienced loudness and the input sound pressure level. Not only are there wide differences in the lowest level that the ear can perceive (the HTL), there are also wide differences in the highest level that the ear can tolerate (the loudness discomfort level or LDL) and differences in the rate of growth of loudness between these two extremes. In some cases, a much higher than normal HTL is combined with a lower than normal LDL, giving a much reduced dynamic range of usable sound levels.

Because of the large differences in degree and pattern of hearing loss, there is also a wide range of hearing aid characteristics required to optimally assist hearing impaired persons. The frequency response of the hearing aid must be selected for the individual hearing loss and may require high order filtering with selection of frequency bandwidth as well as general shape within that bandwidth. The gain of the hearing aid must be selected in accordance with the degree of the hearing loss.

The limiting level of the hearing aid must be selected in accordance with the LDL. A selection of the type of output limiting must be made between peak clipping, or output Automatic Gain Control ("AGC"). Output AGC is an automatic gain control system whose action is related to the output level of the hearing aid. This relation is substantially independent of the setting of the user operated volume control.

If the ear has a much reduced dynamic range, an input AGC system may be needed. Input AGC is an automatic gain control system whose action is related to the input level to the hearing aid. The relation between the action of the input AGC and the input level is also substantially independent of the setting of the user-operated volume control. In the case of an input AGC, a selection must be made of the compression threshold, (the input level at which AGC action begins), and the compression ratio, (the ratio of the decibel change in input to the decibel change in output level).

It is desirable that a single hearing aid be provided with a range of adjustability in these various characteristics. This is important not only because it allows a single hearing aid model to be used for many persons with differing hearing losses, but also because it allows the hearing aid to be readjusted if the initial selection of hearing aid characteristics was incorrect or if the user's hearing loss changes with time.

Because hearing aids are normally worn on the head, they must be small and usually operate with a small, single cell battery for extended periods of time. They must also provide good performance, be highly reliable, and be low in cost. The electronic circuits used to provide the various functions of a hearing aid must also have these same characteristics. Of course, such circuits will also be useful in applications other than hearing aids but having similar requirements.

Prior hearing aids have had limitations in meeting the needs described above. They have been limited in the degree of filtering provided to control the frequency response. When equipped with an input AGC system, they have not provided a well-defined compression threshold and a well-defined compression ratio. Also, they have not provided the needed degree of adjustability in either their frequency response characteristics or in their output level versus input level and AGC characteristics.

Prior electronic circuits also have had limitations in meeting the needs described above. Circuits that are small in size and that can operate with a low supply voltage of about 1.3 volts and that draw little supply current have not provided good performance and have not provided the desired adjustment characteristics. Prior electronic circuits that could meet the performance needs described above have required higher supply voltage and current, have required many components, have been large in size, or have not been in a form in which they could be adjusted by operation of a single control.

In many electronic circuit design applications, such as hearing aids, an input signal is provided. The input signal must then be modified by an appropriate filter. These modifications consist of attenuating the various frequency components of the input signal to differing degrees.

Thus, for example, a hearing aid wearer may have a more serious hearing impairment for sounds having a high frequency than for sounds having a low frequency. Accordingly, a hearing aid should amplify high frequency signals more strongly than the low frequency signals. An appropriate filter may then be used to allow high frequency signals to pass through it substantially unaltered and to substantially attenuate low frequency signals.

In the example described above, the filter is called a highpass filter, since high frequency signals are allowed to pass through the filter substantially unmodified. In addition, a lowpass filter allows only low frequency signals to pass through substantially unattenuated. Still others, known as bandpass filters, only allow signals having frequencies within a specified range to pass through the filter substantially unattenuated.

In designing a hearing aid, it is desirable to use a more effective and yet compact frequency response filter. Frequency responsive filters are commonly shown in the prior art. For highpass or lowpass filters, a predetermined frequency, known as the corner frequency or characteristic frequency of the filter, substantially divides those signals which are allowed to pass through the filter and those which are attenuated. One type of electronic frequency filter employed in a variety of applications is called a Butterworth filter. For example, in a lowpass Butterworth filter, signals having a frequency less than the corner frequency are allowed to pass through the filter substantially unimpaired. A signal with the frequency of the corner, however, is attenuated by approximately three decibels. Signals with a frequency in excess of the corner frequency are attenuated even more than three decibels.

Filters are further characterized by their number of poles. A pole is a complex frequency root of the denominator of the transfer function. The higher the number of poles, the higher will be the rate of attenuation of a Butterworth filter beyond the corner frequency. For example, a two pole highpass or lowpass filter will have a rate of attenuation of 12 decibels per octave and a four pole filter will have a rate of 24 decibels per octave. In many applications it is desirable to have a four pole filter.

Many applications require filters to be as compact and efficient as possible. For example, hearing aids often rest behind or inside the user's ear. Because of the resulting space limitations, all circuits within the hearing aid, including the frequency filter, should be small. Accordingly, the number of components in each circuit should be reduced.

Also, many applications require that the corner frequency of the filter be adjustable. For example, in hearing aids, users that require amplification of different frequencies may use the same hearing aid simply by adjusting the corner frequency of the filter. A user requiring amplification of signals with a frequency above 500 hertz and another second user, needing amplification of signals above 1000 hertz, may both use the same aid by adjusting the corner frequency of the filter, which determines the frequency response of the aid. Nonetheless, such an adjustable filter should still be as compact as possible.

In addition, the varying of the corner frequency of the filter should, if possible, use only a single control. This allows the adjustment of the corner frequency to be done more easily, as well as allowing the manufacture of the aid to be less expensive and providing a more reliable aid.

Furthermore, since a manually adjusted control element is often mounted in a location remote from the filter circuit, it is advantageous if the input signal does not pass through this control element, but rather that the control element varies a control signal which indirectly influences the corner frequency of the filter. Such an arrangement reduces difficulties that may be encountered with feedback, capacitive coupling, or the pickup of unwanted noise, which will affect the actual signal. Moreover, the control signal may be provided by a manually adjusted potentiometer or may be a signal originating with some other processing system within the aid itself. The control signal should be derived from a regulator that produces reference signals that accurately set the adjustment range of the corner frequency control.

In addition, to further decrease the size of the circuit, a large portion of the circuit should be formed on integrated circuits. In many cases, it is desirable to use semi-custom integrated circuits which contain large numbers of substantially identical circuit elements which may be interconnected as desired. Accordingly, the circuit should advantageously use greater numbers of integer multiples of such identical transistors in its design. Also, such integer multiples of substantially identical transistors may be used to increase the accuracy of the expected performance of the circuit.

Many circuit components used in hearing aids are formed on an integrated circuit chip. Transistors and amplifiers are readily available on such chips and usually do not take up inordinate amounts of space. Resistance elements, however, take up large amounts of space (or "real estate") on the chip. Moreover, the absolute value of a resistor formed on a chip is typically not easily kept within a close tolerance. Such typically wide tolerances would make the circuit performance less accurate. External discrete resistors interconnected with the chip may also be used, but such discrete components also use up much of the space available inside of an aid and also require additional connection points to the chip.

Other elements used in a circuit, such as capacitors, are difficult to fabricate on a chip. Of course, if discrete capacitors are used, they, like discrete resistors, take up space inside the aid, so that their number and size should be minimized. Also, the number of connection points to the chip should be minimized.

It is also helpful if the capacitors used have substantially equal values. In this way, the manufacturer need keep fewer items in inventory. Also, he may purchase larger quantities of the single type of capacitor (rather than smaller quantities of different types of capacitors), and thus possibly obtain the capacitors for a lower price. Consequently, the costs for both the manufacturer and consumer may be reduced. Moreover, the use of a single type of capacitor reduces the chance of "mixup," whereby an improper capacitor is used in the manufacture of the aid.

In addition, it is often desirable to have a common AC ground connection to one side of each capacitor. Such an arrangement tends to reduce the noise sensitivity of the circuit. Moreover, the circuit may then have fewer pad connections between capacitors and the integrated circuit, thereby reducing the cost and increasing the reliability of the circuit.

Of course, the filters should function properly with the voltage level supplied by a hearing aid battery, which is typically in the order of only one volt. Additionaly, the filter shall operate with a small current drain, so as to increase the operating life of the battery.

Many commonly available filters only provide a highpass or lowpass or bandpass transfer function, rather than the providing simultaneous highpass, lowpass, and bandpass outputs for a particular input signal. Simultaneous outputs are useful, for example, to split an input signal into highpass and lowpass channels.

INPUT AGC

In many applications, such as hearing aids, it is desirable that a signal amplification or signal transmission system provide a lower gain for high level input signals than for low level input signals. With such an arrangement, a large range of input signal levels can be transformed into a smaller range of output signal levels.

Such an automatic gain control system ideally is described by a compression threshold and a compression ratio. For input signals below the compression threshold, the signal gain is constant and there is no gain reduction. At the compression threshold, gain reduction begins, and, for signal levels increasing above the compression threshold, the gain is progressively reduced. As a result, the rate of change of output level is smaller than the rate of change of input level. The compression ratio relates to signal levels above the compression threshold and is the ratio of the decibel change in output level to the decibel change in output level. Often it is desirable to provide independent adjustment of compression threshold and compression ratio in order to accommodate different types of input signals or different needs of users of the output signal.

In an automatic gain control system, it is often important that the gain be changed smoothly without spurious response. Such a spurious response can occur, for example, if the control signal used to adjust an amplifier gain produces a shift or temporary offset in the amplifier output operating current or voltage at the same time as it is changing amplifier gain. This type of spurious response can be heard as a "thump" occurring during large gain change and generally should be avoided.

It is desirable also that the detector used to sense signal level in an automatic gain control system should respond to both positive and negative excursions of the signal. This provides a more accurate determination of level and produces less signal distortion.

In a hearing aid, such an AGC system may be placed in the signal path from microphone to receiver. The level detector is properly located in this signal path at a point before the user-operated volume control. In this location, the system is called "input AGC", since the AGC action depends on the *input* signal level, independent of the setting of the volume control.

If the hearing aid is also equipped with a widerange tone control, or adjustable filter, it is also desirable that the AGC level detector be placed at a point in the signal path after the filter. In this way, the AGC acts only on the range of frequencies actually being utilized. It would not act on signals rendered inaudible by filtering. If on the other hand, for example, if the AGC detector sensed signal levels before a four pole highpass filter, the AGC system would respond to otherwise inaudible low frequency components of the input signal. As a result the system would produce changes in gain that would unnecessarily and undesirably affect simultaneously occurring high frequency components of the input signal.

In many applications of such an AGC system, it must be as compact and efficient as possible. It must be of a form suitable for implementation on a monolithic integrated circuit and should require few components external to the integrated circuit clip and few interconnections. It should operate on low supply voltage and require little supply current.

COMPANSION SYSTEM

In many electronic systems, it is necessary to transmit signals possessing a high dynamic range through a circuit or circuit element providing limited dynamic range. The dynamic range is the range of signal levels from the lowest useful signal level, usually determined by a noise level, to the highest useful signal level, determined either by the characteristics of the signal itself or by the limiting level or distortion characteristics of the circuit or element.

For example, in a hearing aid, an active filter with adjustable corner frequency normally requires the use of active circuit elements that have a limited dynamic range. With the input AGC system previously described, the active filter is located at a point in the signal path before the user-operated volume control; therefore the input signal level to the active filter cannot be adjusted by the user. If the input signal passes through the filter, the resulting dynamic range will be severely degraded.

This problem is similar to the problem of conveying signals through a transmission medium of limited dynamic range, for example, as in magnetic tape recording and playback. In such cases, some systems, such as the Dolby system, have been developed which compress the signal with some type of automatic gain control system before recording and expand the signal with another AGC system after playback. However, in such systems, the two AGC systems act independently of each other, with the result that attack and release transients are not cancelled out. See U.S. Pat. No. 4,377,792.

What is needed is a compression-expansion ("compansion") system that compresses the signal being applied to the circuit of limited dynamic range and expands the signal leaving that circuit in a substantially exact, complementary manner, without exhibiting attack and release transients at the output of the expander. This compansion system should be compact in size and efficient.

An electronic system may already include an amplifier whose gain is varied by a control signal, such as a hearing aid with an input AGC syetem. In this case, it is advantageous to consolidate functions. Instead of having two variable gain amplifiers, each controlled by its own control signal, it is better to use a single variable gain amplifier controlled by a composite control signal. This requires a compact, efficient circuit for combining control signals in the proper manner.

Another aspect of the present invention is a controlled current source for providing an output current substantially exponentially related to a difference between voltages on first and second input terminals and substantially linearly related to an input current applied to a third input terminal. The controlled current source includes first, second, and third transistors.

The controlled current source may be used, for example, to combine control signals from the AGC system and the compansion system. In this way, one controlled amplifier may be used instead of two. The first transistor is interconnected to the third input terminal to receive the input current and also is interconnected to the first input terminal to receive the voltage applied to it. The second transistor is interconnected to the first as a feedback stage to regulate the emitter voltage of the first and third transistors.

The third transistor is interconnected to the first transistor as well. The third transistor senses the voltage of the second input terminal and responsively provides an output current.

GENERAL OBJECTS

A general object of the present invention is an improved hearing aid. Another objest is a hearing aid with a wider range of control over its frequency responses. Still another object is a hearing aid with a wider range of control over its output level versus input level characteristics.

A further object of the present invention is a hearing aid with wider dynamic range, lower distortion and more consistent operation that will operate effectively on low supply voltage and is more compact, reliable, economical to use, and less expensive to manufacture.

BRIEF DESCRIPTION OF THE DRAWING

Preferred embodiments of the present invention are described herein with reference to the drawing wherein.

GENERAL CIRCUIT

DETAILED DESCRIPTION OF THE PREFERRED EMBODIMENTS

General System Description

Figure 1:
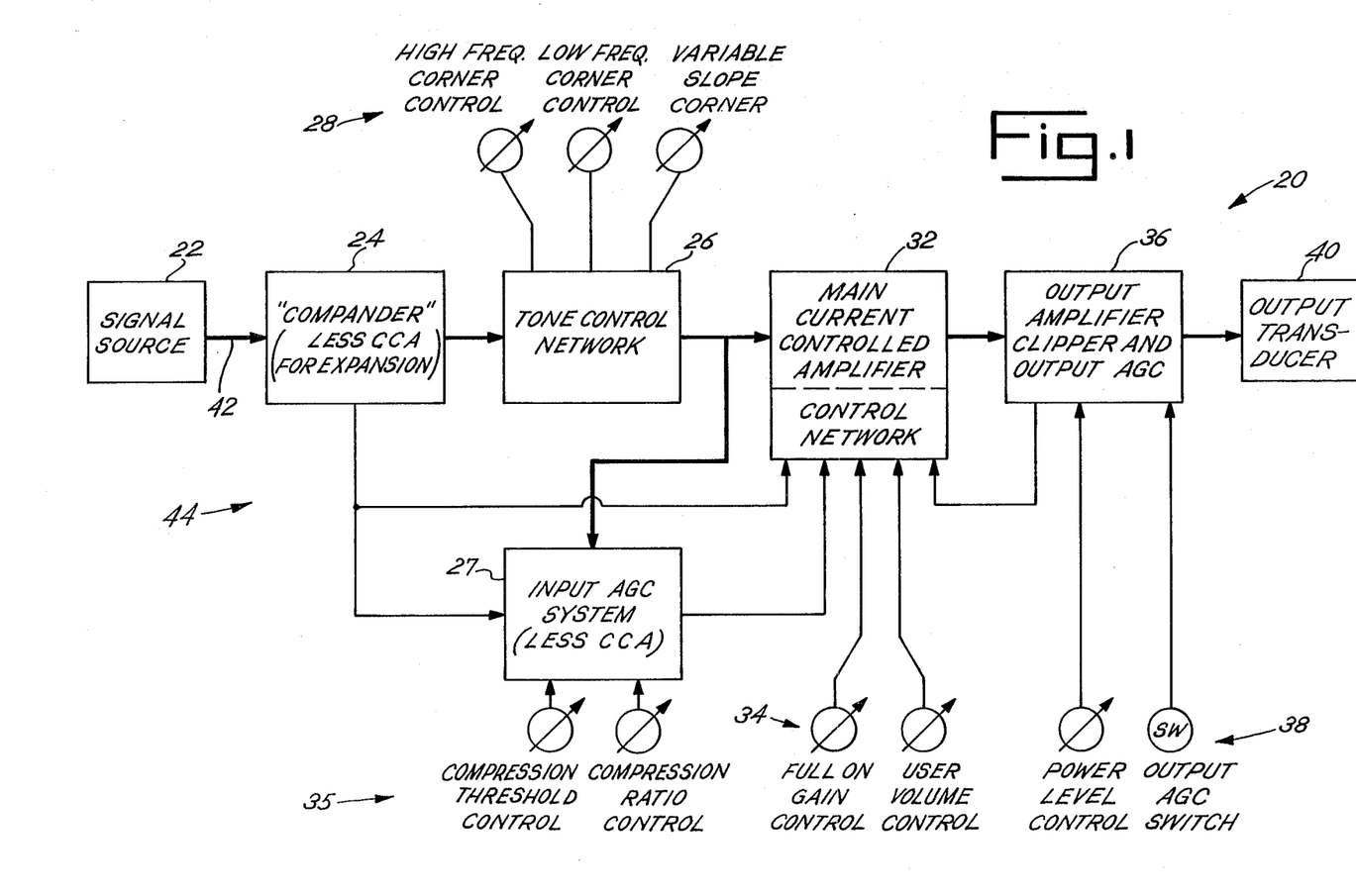
FIG. 1 is a block diagram of the preferred embodiment of the hearing aid of the present invention.
Figure 2:
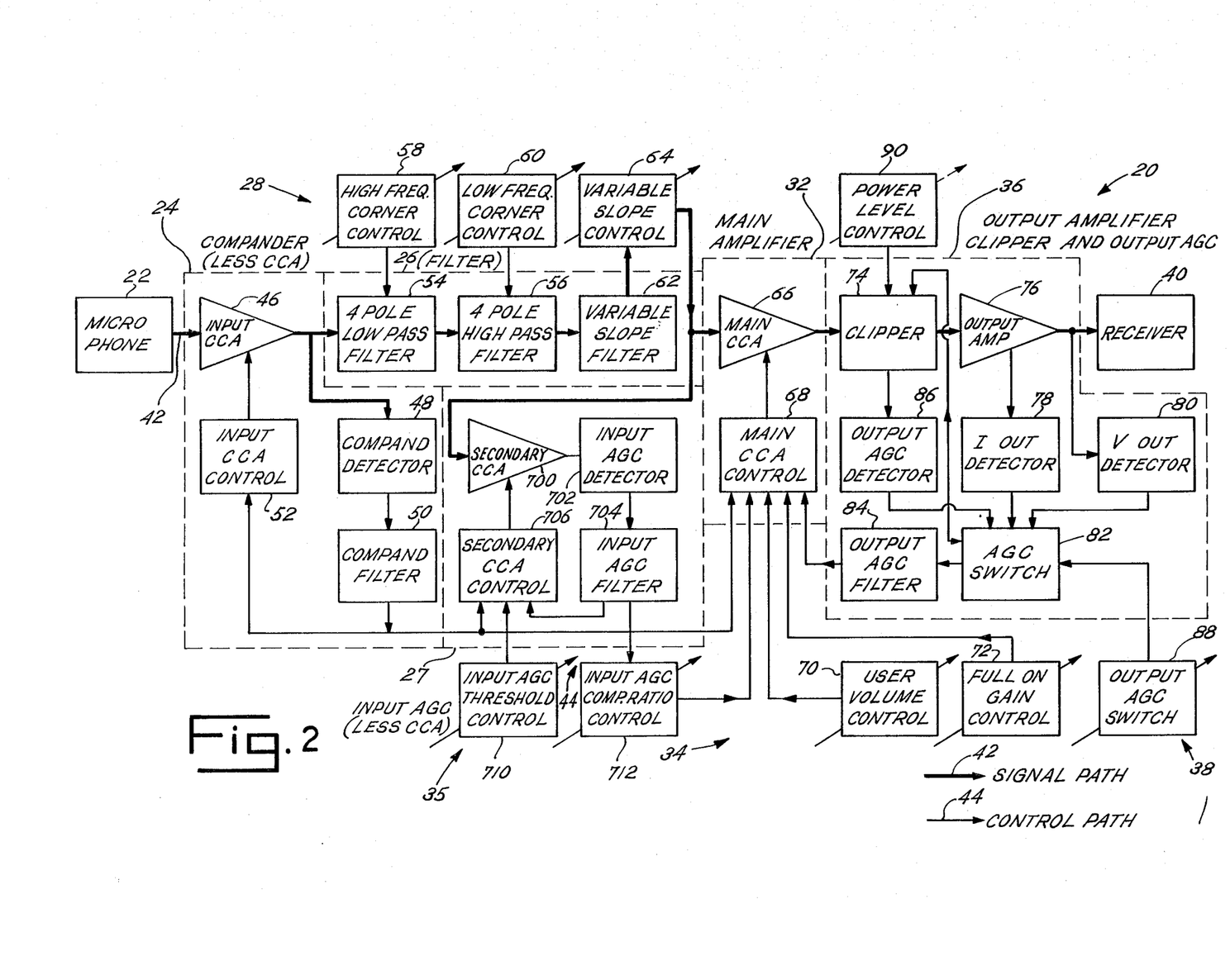
FIG. 2 is a more detailed block diagram of the preferred embodiment of the hearing aid shown in FIG. 1.
Figure 3:
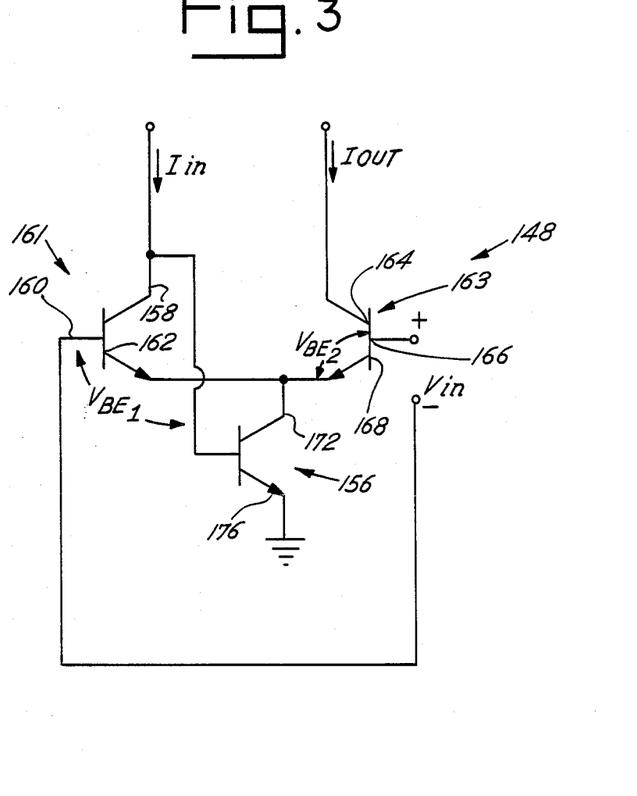
FIG. 3 is a schematic diagram of the controlled current source for the preferred embodiment shown FIG. 1.

Referring to FIGS. 1–3, the preferred embodiment of the present invention is shown as an improved hearing aid circuit, generally designated 20. Significantly, many of the circuits described herein may be used in a variety of different applications. However, the most preferred embodiment of the present invention relates to hearing aids. Thus, the invention has been described in the context of hearing aids.

As shown more clearly in FIG. 1, a hearing aid (not shown) includes a signal source or microphone 22, a "compander" 24, a filter or "tone control network" 26 and related external controls 28, an input Automatic Gain Control ("AGC") system 27 and related external controls 35, a main current controlled amplifier ("CCA") 32 and related external controls 34, an output signal processor 36 and related external controls 38, and a receiver or output transducer 40.

In several figures, dotted lines are drawn about selected circuit components. Such groupings of circuit components has been made somewhat arbitrarily and only as an aid to the reader in understanding the present invention.

As shown in FIGS. 1 and 2, the microphone 22 receives sound signals in the air and responsively transmits an electrical signal along a signal path 42, represented as heavy lines in FIGS. 1 and 2. Certain circuit components affect the electric signal indirectly, by affecting the operation of circuit components, rather than the actual signal itself. The signals from such components are sent via control paths, which are represented by the lighter lines 44 shown in FIGS. 1 and 2.

Electrical signals generated by the microphone 22 have relatively small amplitude and are received by the compander 24. The compander 24 includes input current controlled amplifier 46, a "compand" detector 48, a "compand" filter 50, and an input current controlled amplifier control 52 to vary the gain of the current controlled amplifier 46.

The current controlled amplifier 46 simply increases the amplitude of the microphone signal in a predetermined manner for processing by the rest of the hearing aid circuit 20. The "compand" detector 48 senses when the output of the current controlled amplifier 46 exceeds a predetermined level, outside of the dynamic range of the filter 26.

When the "compand" detector 48 senses such a large signal from the current controlled amplifier 46, it sends a signal to "compand" filter 50. The "compand" filter 50 issues a smoothed compand detector signal, which is received by both the current controlled amplifier control 52 the main CCA control 68 and the secondary CCA control 706. The input current controlled amplifier control 52 then reduces a controlling current which it supplies to the input current controlled amplifier 46 to decrease the amount of amplification exerted by the amplifier 46.

The controlling current from the input current controlled amplifier control 52 is exponentially related to the amplitude of the signal received from the "compand" filter 50. The controlling current received by the main CCA 66 is inversely related to the controlling current to the input CCA 46. The gain of the main CCA 66 is thus inversely related to the gain of the input CCA 46. In this way, the gain through the system is constant, but the filters in the tone control network 26 operate over a narrower dynamic range of signal levels.

The output of the current controlled amplifier 46 is received by the tone control network 26. The tone control network 26 includes a four pole lowpass filter 54, which presents a signal to a four pole highpass filter 56. The two filters 54, 56 are controlled, respectively, by the potentiometers, or controls 58, 60. The settings of the potentiometers 58, 60 determine the frequency at which the low pass and high pass filters 54, 56 will start substantially influencing the signal received.

A signal from the lowpass and highpass filters 54, 56 is transfered to the variable slope filter 62, which further shapes the frequency spectrum of the signal. The variable slope filter 62 presents two signals to a variable slope control 64, which may be adjusted to further attenuate high frequency signals, low frequency signals, or to pass all frequencies equally.

The variable slope control 64 provides a signal to the input AGC circuit 27 and the main amplifier 32. The main amplifier 32 includes the main current controlled amplifier 66 and the main current controlled amplifier control 68. Two external adjustments, a user operated volume control 70 and a full on gain control 72, are interconnected to the main current controlled amplifier control 68. Control 68 also receives input from the compander 24, the output signal processor 36, and the input AGC system 27, which are used to control the gain of the main current controlled amplifier 66.

Thus, when the compander 24 is operating, it sends a signal to the main current controlled amplifier control 68 so that the input to the main amplifier 32 is expanded to the same degree that it was compressed by the input current controlled amplifier 46.

The level of gain that the main current controlled amplifier 66 exhibits is determined, in part, by the inputs to the control 68, including the setting of the user operated volume control 70. The maximum gain obtainable with the user operated volume control 70 full on is established in part by the setting of the full on gain control 72.

The input AGC system 27 includes a secondary CCA 700, an AGC Detector 702, AGC filter 704, secondary CCA control 706, and associated external controls 35 including the AGC threshold control 710 and AGC CR (compression ratio control) 712. In addition the system uses portions of the main amplifier 32, including the main CCA 66 and a portion of the main CCA control 68.

The input AGC system uses a feedback system to establish the control signal, and this control signal is fed forward to the main CCA 66. The secondary CCA 700 amplifies the signal from the variable slope control 64 and sends this amplified signal to the AGC detector 702. The AGC detector 702 senses when the output of the secondary CCA 700 exceeds a predetermined level, called the AGC detector threshold level.

When the AGC detector 702 is triggered by an input reaching or exceeding the threshold level, it sends a signal to the AGC filter 704 which issues a smoothed AGC detector signal (called $V_{c1}$), which is received by the secondary CCA control 706. The secondary CCA control 706 supplies a control current to the secondary CCA 700 to control its gain. This control current is controlled by both the smoothed detector signal ($V_{c1}$) and an external control, the AGC threshold control 710. The detector signal ($V_{c1}$) causes the control current to be reduced, which reduces the gain of the secondary CCA 700 such that its output signal amplitude does not substantially exceed the AGC detector threshold level.

The signal level from the microphone required to trigger the AGC detector 702 is called the input AGC threshold. The AGC threshold control 710 also varies the gain of the secondary CCA 700 so as to vary the input AGC threshold.

The secondary CCA control 706 also receives an inverse controlling signal from the compand filter 50 to expand the previously compressed signal which is present at the variable slope control 64 output. In this way the companion action will not influence the detector signal $V_{c1}$ and the compander will not be "seen" by the input AGC system.

If this smoothed detector signal ($V_{c1}$) is applied to the main CCA control 68, the result would be an AGC system with a very high non-variable compression ratio (CR) above the AGC threshold. To provide variable slope compression, the detector signal ($V_{c1}$) from the AGC filter 704 is passed through a variable control, the AGC CR cntrol 712. The AGC CR control 712 can provide an adjustable portion of the detector signal to the main CCA control 68, which controls the gain of main CCA 66. Thus, for input levels above the AGC threshold, the amount of gain reduction which the input AGC system exerts on main CCA 66 is variable by means of the AGC CR control 712, thereby varying the slope of the input-output curve above the threshold.

The output of the main current controlled amplifier 66 is received by the output signal processor 36. The output signal processor 36 includes a clipper 74, output amplifier 76, output current detector 78, voltage output detector 80, AGC detector 86, internal automatic gain control switch 82, and AGC filter 84. An external AGC switch 88 and a power level control 90 are interconnected to the output signal processor 36.

The clipper 74 prevents any signal received from the main current controlled amplifier 66 from exceeding a certain predetermined output level set by the power level control 90. The output of the clipper 74 is sent to the output amplifier 76, and a secondary output is sensed by the automatic gain control detector 86.

The output amplifier 76 further increases the signal received from the clipper 74, before it is sent to the receiver 40. Current and voltage detectors 78, 80 sense the output current and voltage and provide output signals to the AGC switch 82 when either the output current or the output voltage exceeds a respective predetermined level.

The automatic gain control switch 82 may be switched on with the external AGC switch 88. Signals from the current and/or voltage detectors 78, 80, or from the automatic gain control detector 86 signify that the output of the circuit 20 is too large. Such signals are thus transmitted to the automatic gain control filter 84, which smooths and combines these signals and feeds them back to the main current controlled amplifier control 68 to reduce the amount of gain which the main current controlled amplifier 66 is then providing.

A signal from the output amplifier 76 is applied to the receiver 40, which converts the electrical signal to sound. This sound is then heard by the wearer of the hearing aid.

System Architecture

Much of the advantages of the present system arise from the architecture or placement of the various components. In particular, a compression circuit and an expansion circuit are placed on opposite sides of the voltage controlled filters to increase the dynamic range of the system. See FIG. 21. Moreover, the adjustable peak clipping circuit or clipper 74 is positioned before the fixed gain output stage or output amp 76. As a result, the previously mentioned design problems of providing adjustable clipping at the output of the output stage, such as asymmetrical clipping and sensitivity to output stage bias current, are avoided.

In addition, the adjustable output automatic gain control circuit is located before the fixed gain output stage. As a result, the output automatic gain control may be connected to the clipper 74 to allow the power level control 90 to determine the output limiting level in both AGC and non-AGC modes. In addition, the auxiliary automatic gain control uses both output voltage and output current detection systems 80, 78 at the output stage.

By adding a fixed amplitude detection system at the output of the output stage, a greater undistorted maximum output level from the output stage during use of the output automatic gain control may be safely designed for. This is because the tolerances of the detection level occuring at the input of the output stage as well as the output stage gain do not require that the detection level be set lower to prevent possible clipping in the output stage when the output level control is set to maximum. Instead, the detection level may be set high enough to substantially guarantee full use of the output amplifier's amplitude capability and the fixed amplitude detection at the output of the output stage will override the detection at the input of the output stage when the output level control is set to maximum.

The output voltage detection simply triggers the output automatic gain control if the collector to emitter voltage of the output stage transistors nears saturation, thus preventing clipping and resultant distortion.

The output current detection monitors the current delivered to the receiver and also triggers the output automatic gain control if a predetermined current limit is exceeded. This has a major advantage in the preferred embodiment which is a high power hearing aid. The current state of the art in receiver design produces receivers with widely fluctuating impedance versus frequency which, at some frequencies, can drop very low compared to the average impedance value. When driven by an amplifier capable of driving the receiver to maximum levels where the receiver exhibits nominal impedance, the receiver may draw excessive current from the amplifier at frequencies where receiver impedance is much lower, either exceeding the receiver's own current limits for low distortion operation or possibly the amplifier's linear operation region, which could also increase distortion. Thus, having both current and voltage detection utilizes the maximum output capabilty of the amplifier-receiver system across the frequency range of the system.

In addition, the input automatic gain control circuit uses independent adjustment of the compression threshold and compression ratio and allows for precise adjustment of each of these factors without interaction between the adjustments.

In addition, level detection for the input automatic gain control circuit is located after the tone (or frequency shaping) control 26, but still before the gain control. Applicants have found that such an arrangement provides a more desired signal, since the AGC system is operating on the signal eventually supplied to the receiver and "heard" by the wearer of the aid 20. In other arrangements, the AGC system may operate on signals not yet shaped by the filter or tone control.

Normally, it is desired that selected frequencies of sound signals not passed by the filter, and thus not intended to be amplified by the aid, should not affect the operation of the aid. Since the AGC system of the present invention does not operate on such signals, since they may be effectively attenuated by the filter, such extraneous noise will not significantly influence the operation of the AGC system.

Thus, for example, the filter may be adjusted such that low frequency signals, such as the low frequency sounds emitted by heavy machinery, will be substantially attenuated by the filter. If the AGC level detection occurs before the filter, these signals could cause the AGC system to respond and reduce the gain for higher frequency desired signals. However, the present AGC would not respond to these low frequency signals when they are outside of the filter pass band.

Moreover, the main current controlled amplifier uses a control signal which is a composite of signals. The composite of signals is derived from a plurality of inputs from different sections of the aid. The signal is comprised of the signal from the compander 24, the input AGC system 27, the output signal processor 36, the user-operated volume control 70, and the full-on gain control 72. By using such a composite of signals, a single current controlled amplifier 66, rather than a series of amplifiers, may be used. This reduces the noise generated and complexity of the circuit, as well as allowing the circuit to be made more cheaply.

The hearing aid circuit 20 is comprised of different, smaller circuits. One of these smaller circuits for the overall hearing aid circuit 20 is individually discussed in detail in a separate section below:

Differential Voltage Controlled Exponential Current Source (within, e.g., Input Current Controlled Amplifier Control 52, Main CCA Control 68, and Clipper 74)

An exponential current source 148 shown in FIG. 3 provides means for differentially combining voltages and producing an exponentially related current output. This current is also linearly related to an input current. The current source 148 may be used as a building block to produce complex control functions.

For example, the main current controlled amplifier control 68 combines various control functions to provide a single gain control current to main current controlled amplifier 66 which is exponentially related to a combination of control voltages.

The current source 148 includes a first transistor 161, output transistor 163, and a feedback transistor 156.

The first transistor 161, in the form of a NPN transistor with a collector 158, base 160, and emitter 162, receives the input current, $I_{in}$, as shown in FIG. 23, which is then directed to the feedback transistor 156. By receiving the input current, the first transistor 161 has a base to emitter voltage given by:

$$V_{be1} = V_T \ln\left(\frac{I_{in}}{I_s}\right)$$

where $I_s$ is the saturation current of the transistor.

The output transistor 163 is also in the form of an NPN transistor having a collector 164, base 166, and emitter 168. The emitters 162, 168 of the first and output transistors 161, 163 are interconnected. Accordingly, the first and output transistors 161, 163 form a differential pair.

The feedback transistor 156 is an NPN transistor having a collector 172, base 174, and emitter 176. The base of the feedback transistor is interconnected to the collector 158 of the first transistor 161. The collector 172 of the feedback transistor 156 is interconnected to the emitters 162, 168 of the first and output transistors 161, 162 as shown. A control voltage ($V_{in}$) is applied between the two bases 160, 166 of the first and output transistors 161, 162.

Input current ($I_{in}$) flowing through the collector 158 of the first transistor 161 (minus the small base current of the feedback transistor 156) necessarily flows into the collector 172 of the feedback transistor 156. The feedback transistor 156 regulates the base to emitter voltage of the first transistor 161 such that the collector current of the first transistor substantially equals the input current. Linear changes in the difference in the voltage between the first and second bases 160, 166 necessarily implies that the current through the collector 164 ($I_{out}$) and emitter 168 of the output transistor 163 must change exponentially. The feedback transistor collector 172 also absorbs the current from the emitter 168 of the output transistor 163.

X is the ratio of the area of the emitter 168 of the output transistor 163 divided by the area of the emitter 162 of the first transistor 161.

In the preferred embodiment, the current source 148 is formed on a single integrated circuit. The first and output transistors 161, 163 may accordingly have emitter areas of predetermined ratios. Thus, the output current is given by the following formula:

$$I_{out} = I_{in}\left[\exp\left(\frac{V_{be2} - V_{be1}}{V_T}\right)\right]X$$

where $V_{be2}$ is the voltage between the base 166 and emitter 168 of the output transistor 163, $V_{be1}$ is the voltage between the base 160 and emitter 162 of the first transistor 161, and X is the ratio of the area of the emitter 168 of the output transistor 163 divided by the area of the emitter 162 of the first transistor 161.

The current source 158 provides an exponential change in output current for a linear change in voltage between the base 160 of the first transistor 161 and the base 166 of the output transistor 163. The current source 148 may be used to provide the input current for additional current sources like the current source 148, thus allowing the combination of more than two voltages to exponentially control an output current. Such an arrangement may thus be used to control the gain of the main current controlled amplifier 66. The current source 148 may also be applied in many other hearing aid applications, since a "perceived" linear increase in "loudness" requires a substantially exponential increase in amplitude of the sound. Thus, with the present invention, by turning a linear potentiometer, the user of a hearing aid may achieve an apparent linear change in volume (and an exponential change in amplitude).

In addition, the present embodiment of applicant's invention includes only a limited number of components, thus making the circuit more compact. Moreover, the current source 148 may operate with a very low supply voltage, such as one volt.

It is to be understood, of course, that changes and modifications may be made in embodiments without departing from the true scope and spirit of the present invention, as defined by the appended claims.

What is claimed is:

1. A current source for providing an output current substantially exponentially related to a difference between voltages on a first input terminal and a second input terminal and substantially linearly related to an input current applied to a third input terminal comprising, in combination:

a first transistor having a collector, base, and emitter, said collector being interconnected to said third input terminal, said base sensing said voltage on said first input terminal and having a first base to emitter voltage;

a second transistor, having a second transistor base interconnected to said collector of said first transistor and a second transistor collector, interconnected to said emitter of said first transistor, as feedback means to regulate said first base to emitter voltage, whereby said first transistor collector current is substantially equivalent to said input current; and a third transistor, having a third transistor emitter interconnected to said emitter of said first transistor, having a third transistor base to sense said voltage on said second input terminal, and having a third transistor collector for responsively drawing said output current.

* * * * *